United States Patent [19]

Kaufman et al.

[11] Patent Number: 4,458,173

[45] Date of Patent: Jul. 3, 1984

[54] PRESSURE SENSITIVE ELECTRIC SIGNAL GENERATOR

[75] Inventors: Peter Kaufman; John J. Sharkey, both of Santa Barbara; John Echols, Ventura, all of Calif.

[73] Assignee: Essex-Tec Corporation, Carpinteria, Calif.

[21] Appl. No.: 463,963

[22] Filed: Feb. 4, 1983

[51] Int. Cl.³ .......................................... H01L 41/08
[52] U.S. Cl. .................................... 310/338; 310/328; 310/330; 310/366; 310/339; 310/340; 310/345
[58] Field of Search ............... 310/338, 339, 328, 366, 310/330–332, 340–345; 340/365 A

[56] References Cited

U.S. PATENT DOCUMENTS

| | | | |
|---|---|---|---|
| 3,935,485 | 1/1976 | Yoshida | 310/339 |
| 3,940,637 | 2/1976 | Ohigashi et al. | 310/339 |
| 4,190,785 | 2/1980 | Kompanek | 310/339 X |
| 4,234,813 | 11/1980 | Iguchi et al. | 310/339 X |

*Primary Examiner*—Mark O. Budd
*Attorney, Agent, or Firm*—Learman & McCulloch

[57] ABSTRACT

A device is disclosed which is useful to generate electric signals particularly in close quarters. The preferred embodiment is described in terms of a piezoelectric signal generator incorporated into the beltline trim of an automobile and an alternate configuration in a flat sheet metal application. The invention is discussed in terms of its ability to take advantage of already existing structural elements of its host body and its ability to be attached without putting holes in such structure.

7 Claims, 2 Drawing Figures

PRESSURE SENSITIVE ELECTRIC SIGNAL GENERATOR

BACKGROUND OF THE INVENTION

The present invention relates to a device which generates electric signals and more particularly the invention relates to a signal generator which is integrated into the structural elements of an existing functional apparatus such as an automobile fender, a deck lid or a trim piece.

During the past several years electric signals produced with piezoelectric materials have been considered for use in automobiles, elevators, telephones, appliances, and similar type products. U.S. Pat. No. 4,206,491 entitled "Entry System" describes an overall apparatus which could include a piezoelectric signal generator of the type disclosed in U.S. Pat. No. 4,190,785 entitled "Pressure Sensitive Signal Generator Using Piezoelectric Coatings." Further, when used in harsh environments particularly in automotive applications, the signal generator may appear as an embodiment as is disclosed in the U.S. Patent entitled "Encased Piezoelectric Signal Generator" which is filed concurrently with the present application and is assigned to a common assignee.

In some applications requiring the generation of electric signals, the signal generator is preferably attached to the surrounding environment in a manner which is cosmetically appealing or maybe even undetectable. This would be the case in an application involving an automobile hood, truck or door lock. An undetectable attachment means might be especially desirable, if the signal generator application is the deactivation of a burglar alarm system on an automobile.

In addition to the inconspicuousness requirement of some applications, a signal generator, is often faced with severe location requirements particularly in the automotive environment. The industry is experiencing an overall effort to reduce the size and weight of automobiles and to more efficiently utilize the resulting space in any particular design. These factors, in addition to the distinct trend toward greater sophistication and additional accessory features in automobiles very often results in demanding specifications in the form of components which are small and lightweight but rugged and durable.

SUMMARY OF THE INVENTION

An object of the present invention is to provide an electric signal with an apparatus such as a piezoeletric generator in a versatile assemblage which is conveniently installed in small quarters without interrupting the integrity of the host body with attachment means.

According to the present invention in a generic embodiment, an electric signal generator is formed from a relatively thin strip of sheet metal or plastic which is capable of bending or flexing, a backup strip of relatively rigid material which cooperates with the thin strip and forms a narrow pocket therebetween, and means for generating an electric signal which are fitted into the narrow pocket and are responsive to bending or flexing of the thin strip without a need to interrupt the integrity of the thin strip with holes or penetrating mechanisms for attachment. According to the present invention in a preferred embodiment, an electric signal generator is formed with a sandwich element comprising piezoelectric material bonded to a substrate and suitable electrical connectors, the sandwich element being bonded to an electrical conductive surface such as a strip of sheet metal or a strip of metallic molding as is used in an automobile, and also being supported by a backup strip of relatively rigid material. In essence the electric signal generator concept in accordance with the present invention is directed to switches applied to existing metal or plastic members in a fashion which utilizes either bending or flexing inherent in such member to produce an electric signal without requiring holes or affecting the structural integrity of the member.

The present invention avoids the need for any mechanical holddown devices such as screws or rivets and therefore holes are not required through the surface to which the signal generator is attached. This is a significant consideration because the aesthetic appeal of the installation is improved while the introduction of possible sites for corrosion and moisture leakage is avoided. Further, the invention is adaptable to almost any relatively flat surface such as may occur on a door, trunk, hood, fender, deck lid, door handle, instrument panel or trim piece including the beltline molding of an automobile as long as the surface will bend or flex in response to surface loading. A signal generator in accordance with the present invention is small and therefore lightweight and easy to install in tight quarters. The device is rugged and yet easy to service or replace provided there is ready access to the back of the surface to which the signal generator is attached.

The recited as well as other features, objects, characteristics and advantages of the present invention will become more apparent with the reading and comprehension of the drawing and the description of preferred embodiments which follow.

DESCRIPTION OF THE PREFERRED EMBODIMENT

Figure 1:
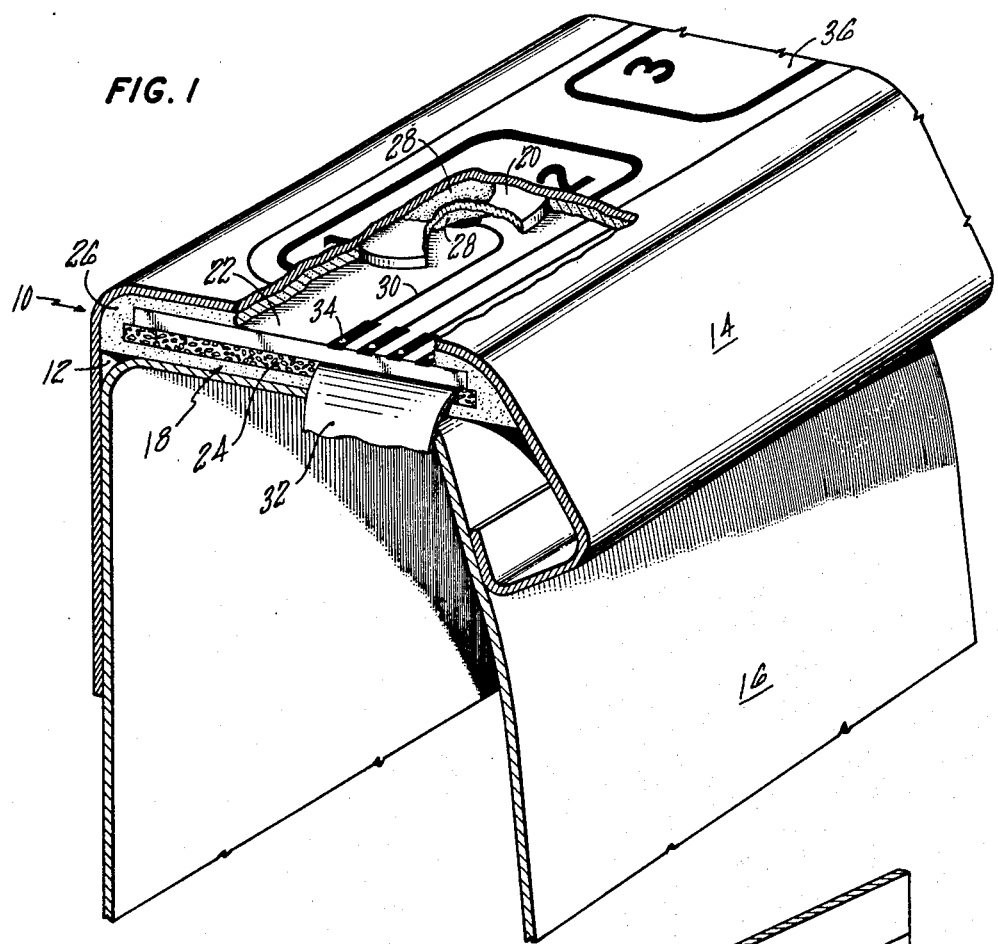
FIG. 1 is a partially broken away assembly of one preferred embodiment of the present invention shown in schematic perspective in a beltline molding application for an automobile.

A signal generator assembly 10 is shown schematically in a partially broken away perspective view in FIG. 1. A cavity 12 is formed between a beltline molding 14 and a backup plate 16. Fitted into the cavity is a sandwich element 18 comprising a region of piezoelectric material 20, a substrate member 22, and a compressible backing material 24. A bonding material 26 attaches the backing material to the backup plate 16 as well as the substrate member 22 to the beltline molding 14. The bonding material is either flexible or rigid.

In the fabrication of the sandwich element, the piezoelectric material is attached to the substrate member with a conductive bonding material 28. The same type of conductive bonding material is used to form an electrically conductive bond between the top of the piezoelectric material 20 and the bottom or inside surface of the beltline molding 14. Also shown in FIG. 1 is a copper trace 30 arranged so that a discrete electrical conductor path connects the piezoelectric material to the edge of the substrate member. A ribbon cable 32 which contains a plurality of individual conductors so that each of the copper traces 30 has a corresponding conductor as necessary is joined to the sandwich element near the edge of the substrate member 22. Connectors 34 penetrate the substrate member and join each copper trace to a conductor in the ribbon cable. The conductive bonding material 28 is used also to join the piezoelectric material to the underside of the beltline molding to allow a continuous circuit between the copper trace and the beltline molding. The compressible backing material 24 is elastomeric in nature and serves two main purposes. The operation of this embodiment requires a bending or flexing of the beltline molding 14 and since the cavity 12 is essentially filled, as the molding is flexed the backing material is compressed and alternatively as the molding is released the backing relaxes to its original contour. Also, the compressible material serves to dampen out vibrations in various applications particularly those automotive.

In some applications a signal generator, in accordance with the present invention, comprises five separate regions of piezoelectric material aligned in a row as is suggested in FIG. 1. When such an embodiment is attached to the beltline molding, each of the active regions of piezoelectric material is located adjacent to a designated touch area appearing on the exposed or outer surface 36 of the beltline molding. The touch areas are identified by a decorative form and as shown in FIG. 1, the decorative form is a decal having a rectangular outline encompassing a pair of numbers. Graphics may be used to show the location for applying force to the generator. With a five active region generator the operator is able to tap out an appropriate sequence of signals from these regions to provide an input signal to a cooperating electronics package which forms no part of the present invention. The operation of such a signal generator can be as is described in the background patents previously identified.

Figure 2:
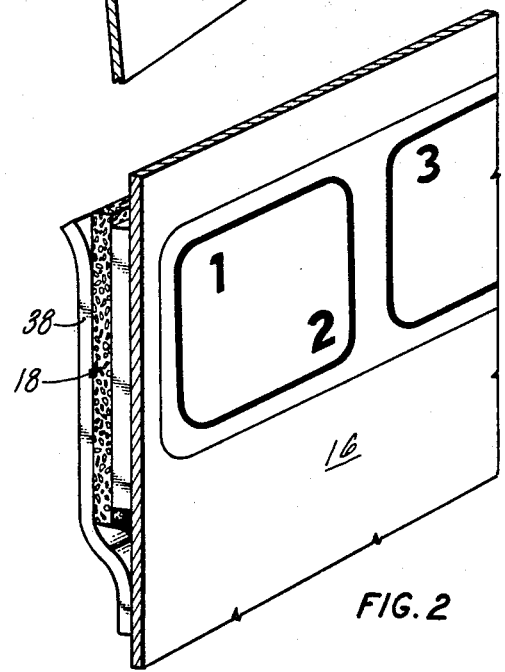
FIG. 2 is a schematic perspective of the present invention in an alternative embodiment which involves attachment of the signal generator to an essentially flat metal sheet.

An alternate embodiment of the invention is shown in schematic form in FIG. 2. The sandwich element 18 is shown pinched between a slip 38 and a sheet 16 of essentially flat metal. There is no significant difference in construction between the apparatus shown in FIGS. 1 and 2 demonstrating pretty clearly the versatility of the present invention. The alternate embodiment in FIG. 2 is suitable for a side door installation in an automobile for example while the embodiment in FIG. 1 describes the present invention installed in a piece of trim such as a beltline molding.

We have described various embodiments of our invention which is new and we seek in Letters Patent issued by the Unites States of America our invention which we claim as:

1. Apparatus for generating an electric signal comprising:
   a strip of bendable material having an outer surface and an inner surface;
   a strip of rigid material which cooperates with the bendable material and forms a pocket therebetween;
   means for initiating an electric signal in response to a deflection in the bendable material;
   a substrate having a top surface and a bottom surface;
   an electrically conductive lead attached to and extending from the signal generating means to an edge of the substrate;
   means for bonding the signal generator to the inner surface of the bendable material;
   a ribbon cable extending from the edge of the substrate and together with the electrically conductive lead and the means for initiating an electric signal forming a continuous electric circuit;
   a sheet of compressible elastomeric material adjacent to the bottom surface of the substrate;
   means for bonding the compressible elastomeric material to the bottom surface of the substrate;
   means for bonding the compressible elastomeric material to the strip of rigid material, and
   means for bonding the top of the substrate to the inner surface of the bendable strip.

2. Apparatus for generating an electric signal with piezoelectric material comprising:
   a strip of bendable metal having an outer surface and an inner surface;
   a strip of stiff metal which cooperates with the bendable metal and forms therebetween a cavity;
   at least one region of piezoelectric material having a top surface and a bottom surface;
   a nonconductive substrate having a top and a bottom;
   an electrically conductive lead attached to and extending from the bottom surface of the piezoelectric to an edge of the substrate;
   conductive material bonding the bottom of the piezoelectric material to the top of the substrate and forming a conductive path between the piezoelectric material and the lead;
   conductive material bonding the top surface of the piezoelectric material to the inner surface of the bendable metal;
   a ribbon cable extending from the edge of the substrate and together with the lead and the piezoelectric material forming a continuous electric circuit;
   a sheet of compressible elastomeric material adjacent to the bottom of the substrate;
   means for bonding the compressible elastomeric material to the bottom of the substrate;
   means for bonding the compressible elastomeric material to the sheet of stiff material; and
   means for bonding the top of the substrate to the inner surface of the bendable metal.

3. Apparatus for generating an electric signal with piezoelectric material including:
   an exposed strip of bendable metal in combination with a strip of stiffer backing material which cooperates with the bendable metal to form a cavity;
   a sandwich assembly which fits into the cavity and comprises:
      a plurality of regions of piezoelectric material adjacent to one another,
      a substrate member of dielectric material which supports the piezoelectric material, copper traces formed on the substrate member with an individual trace leading from a respective region of the piezoelectric material to an edge of the substrate member, and
      a pliable backing material attached to the underside of the substrate member;
   means for bonding the sandwich to the bendable metal at each location containing a region of piezoelectric material to form an electrically conductive bond between the bendable metal and the piezoelectric regions; and
   means for joining the pliable backing material to the strip of stiff material which cooperates with the bendable metal in forming the cavity.

4. Apparatus for generating an electric signal in an automobile having a cavity formed between and acessible strip of conductive metal and a cooperating backing strip wherein the apparatus comprises:
- a flat substrate of dielectric material having a top and a bottom surface;
- a plurality of separate regions, each having an individual flat piezoelectric member which is bonded on one of its sides to the top of the dielectric substrate and is bonded on the other of its sides to the strip of conductive metal;
- a plurality of conductive paths on the substrate, each one of which forms an electrically conductive path between one region of the piezoelectric material and an edge of the substrate;
- a compressible elastomeric backing material bonded to the bottom surface of the substrate; and
- a ribbon cable having a plurality of conductive paths each one of which is connected a corresponding electrically conductive path at the edge of the substrate.

5. The subject matter of claim 1 in which:
one of the said strip of bendable material and the said strip of rigid material is a portion of the visable coachwork of a vehicle, and
the other is a localized addition to said visable coachwork and is attached thereto at said portion by said means for bonding.

6. The subject matter of claim 2 in which:
one of said strip of bendable metal and the said strip of stiff metal is a portion of the visable coachwork of a vehicle, and
the other is a localized addition to said visable coachwork and is attached thereto at said portion by said means for bonding.

7. The subject matter of claim 3 in which:
one of said exposed strip of bendable metal and said strip of bendable metal and said strip of stiffer backing material is a portion of the visable coachwork of a vehicle, and
the other is a localized addition to said visible coachwork and is attached thereto by said means for bonding and said means for joining.

* * * * *